(12) United States Patent
Weidenheimer et al.

(10) Patent No.: US 7,002,188 B2
(45) Date of Patent: Feb. 21, 2006

(54) LASER-GATED AND PUMPED MULTI-LAYER SEMICONDUCTOR POWER SWITCH WITH REDUCED FORWARD LOSSES

(75) Inventors: Douglas M. Weidenheimer, Brentwood, CA (US); David Giorgi, Solana Beach, CA (US); John Sethian, Burke, VA (US)

(73) Assignees: The Titan Corporation, San Diego, CA (US); The United States of America as represented by the Secretary of the Navy, Washington, DC (US)

(*) Notice: Subject to any disclaimer, the term of this patent is extended or adjusted under 35 U.S.C. 154(b) by 62 days.

(21) Appl. No.: 10/651,081

(22) Filed: Aug. 29, 2003

(65) Prior Publication Data
US 2005/0047459 A1 Mar. 3, 2005

(51) Int. Cl.
H01L 29/74 (2006.01)
(52) U.S. Cl. .................................. 257/113
(58) Field of Classification Search ........... 257/113; 372/50
See application file for complete search history.

(56) References Cited

U.S. PATENT DOCUMENTS 6,154,477 A * 11/2000 Weidenheimer et al. ...... 372/50
6,218,682 B1 * 4/2001 Zucker et al. ............... 257/113

* cited by examiner

Primary Examiner—MinSun Oh Harvey
Assistant Examiner—James Menefee
(74) Attorney, Agent, or Firm—Rothwell, Figg, Ernst & Manbeck

(57) ABSTRACT

A laser-activated semiconductor switching device includes a semiconductor assembly including a multi-layer semiconductor structure having a first principal surface, and a laser assembly. The laser assembly includes at least one laser device and is directly connected to said first principal surface. The first principal surface includes a window area from which a metallization layer and an emitter layer of the semiconductor assembly are masked, such that laser light emitted from the laser assembly impinges through the window area directly onto a base layer of said semiconductor assembly to initiate current conduction by said switching device.

22 Claims, 7 Drawing Sheets

LASER-GATED AND PUMPED
MULTI-LAYER SEMICONDUCTOR POWER
SWITCH WITH REDUCED FORWARD
LOSSES

FIELD OF THE INVENTION

The present invention relates generally to semiconductor switching devices. More particularly, the present invention relates to a semiconductor power switch, such as a thyristor, controlled by a laser array. The laser array is controllable to introduce photons into the active region of the semiconductor power switch and activate the switch for permitting current to pass therethrough to a load.

BACKGROUND OF THE INVENTION

The present invention is an improvement to laser-triggered multi-layer semiconductor power switches as disclosed in U.S. Pat. No. 6,154,477 issued to Weidenheimer et al. on Nov. 28, 2000, which is incorporated by reference herein in its entirety.

Semiconductor switching devices, such as transistors, diodes, MOSFETs and thyristors, are well known in the art. These devices have a semiconductor structure, such as silicon, GaAs and the like, having regions or layers with implanted dopants (impurities) at density levels determined by the type of semiconductor device and its desired application. The type of dopant implanted dictates whether the doped layer is a positively doped layer (a p-layer) or a negatively doped layer (an n-layer). The number and arrangement of layers varies depending on the type of device.

For example, a thyristor is a 4-layer semiconductor structure with alternate n and p layers arranged in the order n-p-n-p. Thyristors are commonly used as high power switching devices that are capable of operating in high current environments. Metal layers are attached to opposite sides of the multi-layer semiconductor structure, wherein the metal layer attached to the n-side of the structure functions as a cathode electrode of the device, and the metal layer attached to the p-side of the structure functions as an anode electrode of the device. Gate structures, which control activation of the switch device, are formed on the device, such as for example on the cathode side of the device.

The device including the anode electrode, cathode electrode and gate structures can then be mounted in a suitable housing, such as an insulative housing having anode and cathode terminals which are coupled to the anode electrode and cathode electrode, respectively, of the device. The housing also includes gating terminals that are coupled to the gate structures of the device.

The assembled power switching device can then be employed, for example, as a switch that is controlled to regulate high ampere current being provided to a load. In this type of application, the cathode or anode of the power switching device can be coupled to a power supply, and the anode or cathode can be coupled to the load. When a control current is applied to the gate terminal, current carriers (i.e., electron-hole pairs) are generated in the semiconductor structure that initiates regenerative carrier production in the active region of the device. This permits current provided by the power supply to flow through the switch to the load. The thyristor device turns on when the anode-cathode voltage is greater than the forward voltage of the thyristor Vf and a positive pulse signal is applied at the gate input terminal (g>0). The pulse height must be greater than 0 and last long enough to allow the thyristor anode current to become larger than the latching current Il.

The thyristor device turns off when the current flowing in the device becomes 0 and a negative voltage appears across the anode and cathode for at least a period of time equal to the turnoff time Tq. If the voltage across the device becomes positive within a period of time less than Tq, the device turns on automatically even if the gate signal is low (g=0) and the anode current is less than the latching current. Furthermore, if during turn-on, the device current amplitude stays below the latching current level, the device turns off after the gate signal level becomes low (g=0).

The turnoff time Tq represents the carrier recovery time: it is the time interval between the instant the anode current has decreased to 0 and the instant when the thyristor is capable of withstanding the positive voltage between the anode and cathode without turning on again.

Laser-activated semiconductor switches are also well known in the art. Such switches generally employ a laser that operates as the gating device in place of the conventional gating structure that accepts a control voltage signal. The laser emits laser light photons that are absorbed by the semiconductor structure to generate the electron-hole pair current carriers, which permit current to flow through the semiconductor structure.

The '477 patent provides an improvement to laser-activated semiconductor switches by providing a laser-activated semiconductor switching device having a semiconductor structure and laser array which are packaged together as a single unit, to therefore reduce the size of the device. The laser-activated semiconductor switching device of the '477 patent is capable of handling very high current and a very high rate of current rise, so that the switching device can be employed as a high power switching device.

FIG. 1 is a schematic diagram of a semiconductor power switch assembly and drive circuit as disclosed in the '477 patent. The assembly includes a semiconductor structure 102 and a laser array 104 including a laser diode 122 and a conductive housing 120. Drive circuit 128 includes a resistive divider comprising resistors 130 and 132, which are coupled in series with each other across a load HV, and a resistor 134 having one terminal coupled to the connection point between resistors 130 and 132. The circuit 128 further includes a laser driving circuit 135 including capacitor 136, zener diode 138, diode 140, resistors 142 and 144, and opto-thyristor 146 connected as shown. Capacitor 136, zener diode 138, diode 140, resistors 142 and 144, and opto-thyristor 146 are housed in the same housing 120 in which the laser diode(s) 122 are housed that the circuit drives.

Energy for driving the laser(s) 122 is stored in capacitor 136. The capacitor 136 should be rated at from about 10 to about 100 volts, depending on the type of application in which the lasers are being used. Voltage is regulated across the capacitor 136 by a zener diode 138. Energy to charge the capacitor 136 is obtained from the resistive voltage divider circuit. This divider circuit is connected across the switch assembly and external to the switch assembly as shown. Buswork 148 connecting the lasers 122 is designed for low inductance series/parallel configurations.

The switch assembly is activated by the generation of charge carriers by photon interactions with the semiconductor material of the multi-layer structure 102. The photons generated by the lasers 122 are absorbed in the semiconductor material, and the laser light is attenuated according to the characteristic absorption length for the specific wavelength of laser emission. The characteristic wavelength for laser emission is chosen so that the photon energy (in direct bandgap materials), or the photon energy plus the optical phonon energy (in indirect bandgap materials such as silicon), exceeds the band gap energy in the semiconductor material. Thus, for a selected wavelength and given amount of emitted laser light intensity, there is an optimum useful semiconductor layer thickness.

Photo-activated switching proceeds in the following manner. The rate of current rise (di/dt) is initially controlled by the laser light generated photoconductivity. During the period of time before carrier regeneration begins, the di/dt capability of this switch depends on the rate of photo-generation of electron-hole pairs. Assuming that there is some forward voltage bias present across the switch, there is a depletion region formed on both sides of the blocking junction. Photo-generated e-h pairs that are present in the depletion regions, and those within a diffusion length of these regions, are the active carriers for this switch. The high electric fields in these depletion regions accelerate the e-h pairs toward the blocking junction where they are separated into electrons and holes and subsequently move toward the anode and cathode terminals respectively. This movement of carriers toward and then across the common base junction starts a regenerative process by which more carriers are produced by the action of the "2 transistor model" for this kind of switch. When the regenerative action is established, the current through the switch and its rate of rise (di/dt) is determined by the regenerative process rather than solely by photon-induced carrier fluence. The switch remains in the conducting state until the forward current drops below the "holding" minimum and all of the free carriers in the bases recombine.

There remains a need in the art for improvements to the laser-triggered semiconductor power switch device described in the '477 patent. For example, there exists a need for reduction in the amount of power dissipation in the switching device during the time that the switching device is conducting current from the power source to the load. Such power dissipation represents a waste of energy in that the energy dissipated in the thyristor is energy that is not provided to the load.

SUMMARY OF THE INVENTION

An object of the present invention, therefore, is to provide a laser triggered semiconductor switching device having a structure that enables a mode of operation having significantly reduced forward losses. In particular, according to the present invention the semiconductor power-switching device is continuously pumped by the activating laser during the time that the switching device is conducting current. The present inventors have found that such continuous laser pumping results in significant reduction in power dissipation levels in the semiconductor power switching device and in total energy loss within the semiconductor power switching device.

BRIEF DESCRIPTION OF THE DRAWINGS

The present invention will become more fully understood from the following detailed description of the preferred embodiments taken in conjunction with the accompanying drawings, in which.

DETAILED DESCRIPTION OF THE INVENTION

According to the present invention, instead of applying to the semiconductor power switch a laser light pulse of duration only long enough to initiate carrier regeneration, laser light is continuously pumped into the semiconductor material for the entire time or for a substantial amount of time during which the semiconductor power switch is conducting current. Such operation has been found to achieve significant reductions in the forward losses and peak power dissipation experienced by such laser-activated semiconductor power switches.

Figure 2A:
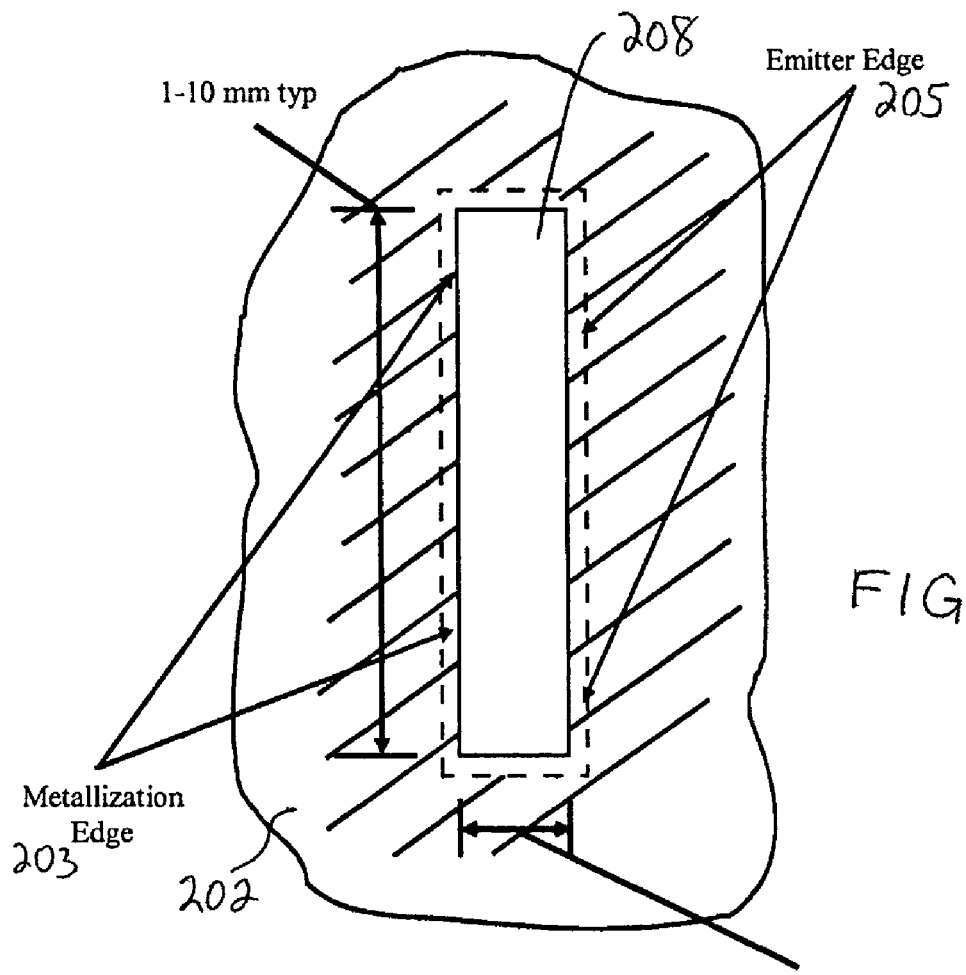
FIGS. 2A and 2B are respective top and side cross-sectional elevation views of the laser light entrance window in the metallization layer adjacent to the laser assembly 104 in the power switch assembly shown in FIG. 1.
Figure 2B:
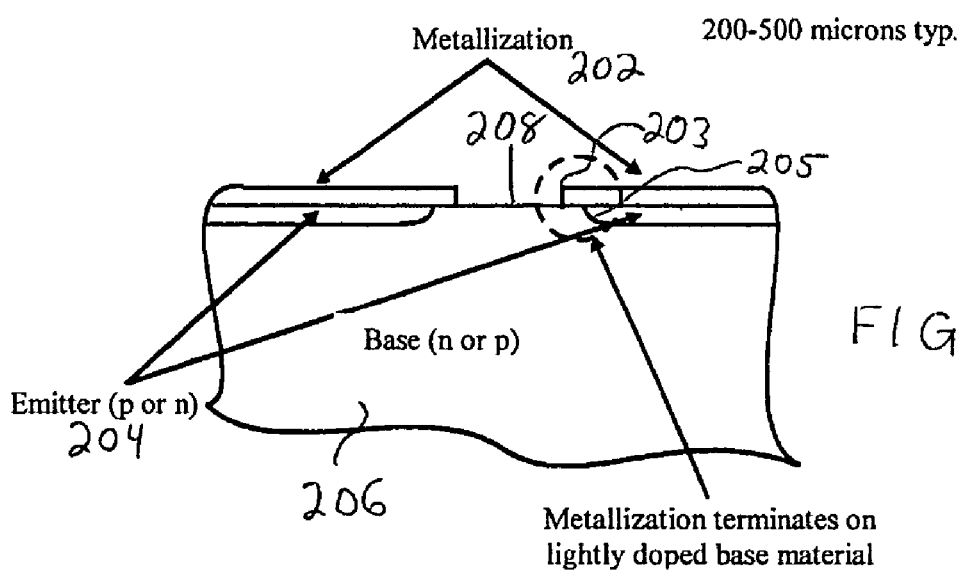

FIGS. 2A and 2B show the laser light entrance window structure detail for a semiconductor power switch device according to the present invention. The window structure is applicable to a laser gated and pumped thyristor (LGPT) switch as well as a laser pumped diode (LPD). Hereinafter, the present invention will be described with respect to an LGPT for purposes of explanation; however, it will be recognized that the invention is equally applicable to other semiconductor structures, such as the LPD for example, in that the same reduction in forward voltage drop is achieved.

As shown, the highly doped emitter layer 204 implanted into the (n or p) base layer 206 is masked from the surface area 208 of the semiconductor switch device onto which the laser light output is incident. The metallization layer 202 also is masked from this surface area, but overlaps the emitter layer edge 205 such that the metallization layer edge 203 terminates over high resistance base material, thereby mitigating current "crowding" at the edges of the metallization layer. As shown, the length of the laser entrance window is preferably in the range of 1–10 mm, while the width of the window is preferably in the range of 200–500 microns, depending on the size of the laser, setback of the laser from the surface, and other application-specific parameters. Masking of the emitter layer from the window area reduces the amount of light absorbed in the interior of the thyristor in the first pass and thus increases first pass optical efficiency. In the LPD case the boost implant layer is masked from the window area. The presence of the boost implant at the points of contact in the LPD assures good ohmic contact between the semiconductor (e.g. silicon) and the metallization.

One preferred embodiment of the invention utilizes a quasi-symmetric thyristor (i.e., silicon controlled rectifier). The term quasi-symmetric refers to the fact that the p-base region of the device is thin (50 microns or less) and that the device has no field-stopper (n buffer) layer as found in most asymmetric devices. The thin p-base limits the reverse voltage blocking capability to a fraction of the forward voltage blocking capability. The shorter carrier transit time in the thin p-base produces thyristor action sooner than in thick p-base (fully symmetric) devices.

The thyristor also employs thin (10 microns or less) emitters and laser light entrance windows through the emitters for the laser light to pass directly into the base region. Since the laser light of interest here (1060–1170 nm) is more strongly absorbed by the highly doped emitters, keeping their thickness to a minimum while providing enough carriers for the operating current density of the device is critical. The windows allow passage of the laser light directly into the lightly doped base region where it is less strongly absorbed (longer absorption length) and able to propagate via reflection and refraction to produce a more homogeneous distribution of photo-carriers in the device. The windows also serve to allow the surface contact metallization edges to overhang the emitter edges and terminate in lightly doped material to prevent current crowding as occurs when the edges terminate in highly doped material, as described above. Such a device can be used in applications that require high di/dt, high current density and charge transfer, low forward losses and forward voltage blocking only.

Another preferred embodiment utilizes a fully asymmetric thyristor design in which the n-base is made thinner for the same blocking voltage by the inclusion of an n-buffer layer (field stopper). The asymmetric design produces less forward drop than a quasi-symmetric or fully symmetric design for a given operating voltage, but is more difficult to passivate. The p-base in this device can also be thin such that the device produces thyristor action quickly.

A third preferred embodiment utilizes a fully symmetric thyristor design in which the forward and reverse blocking voltages are nearly equal. Such a device has a thick p-base (>50 microns) and thyristor action is delayed compared with the thin p-base devices.

Figure 3:
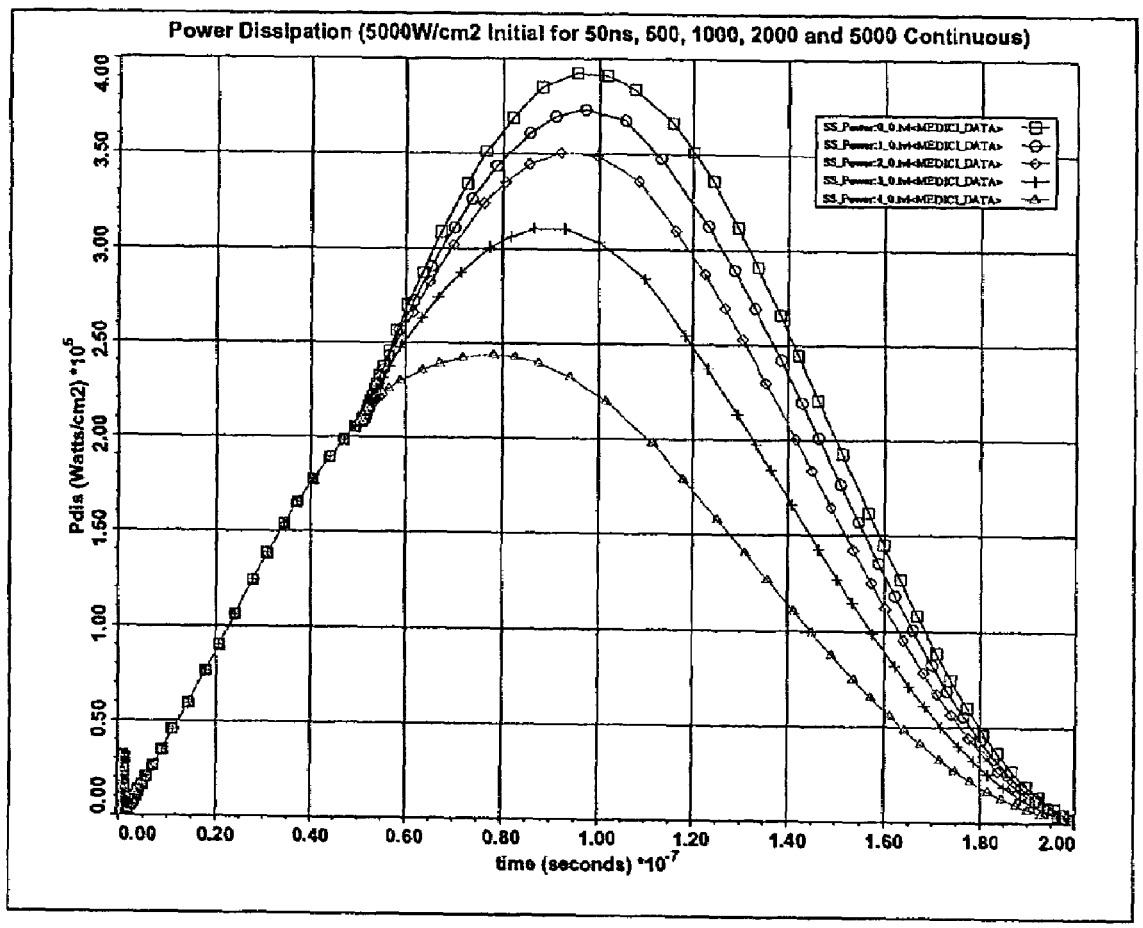
FIGS. 3–7 are graphs illustrating power dissipation versus time for a semiconductor thyristor power switch operating under varying laser light pulse parameters according to the present invention.

FIGS. 3–7 show simulation-calculated power dissipation per cm$^2$ versus time, for an 18 kV breakdown asymmetric thyristor at 2 kiloamps (kA) per cm$^2$ current density. In FIG. 3, the current pulse through the thyristor is sinusoidal with a base-to-base width of 200 nanoseconds. The uppermost curve represents the case where only a triggering light pulse is applied (5 kW (optical) for 50 nsec). The second through fifth curves represent an illumination level of 500, 1000, 2000 and 5000 watts per cm$^2$ of 1100 nm light, respectively, for the full 200 nanoseconds of the thyristor current pulse. A figure of merit (FOM) for an LGPT or LPD according to the invention is the photonic pump gain. The photonic pump gain is defined as the ratio of net savings in energy/power dissipated in the semiconductor power switching device to the energy/power used to produce the laser pump photons. The photonic gain here is ($\Delta$ Pdis/electrical power to generate photocarriers). Based on current laser drive designs the gains are 8.0, 8.0, 8.0 and 6.0 respectively. Thyristor action (i.e., carrier regeneration) has barely begun by the end of the pulse, meaning that most of the conducted current is supplied by the laser-produced carriers, and the gain numbers are low.

Figure 4:
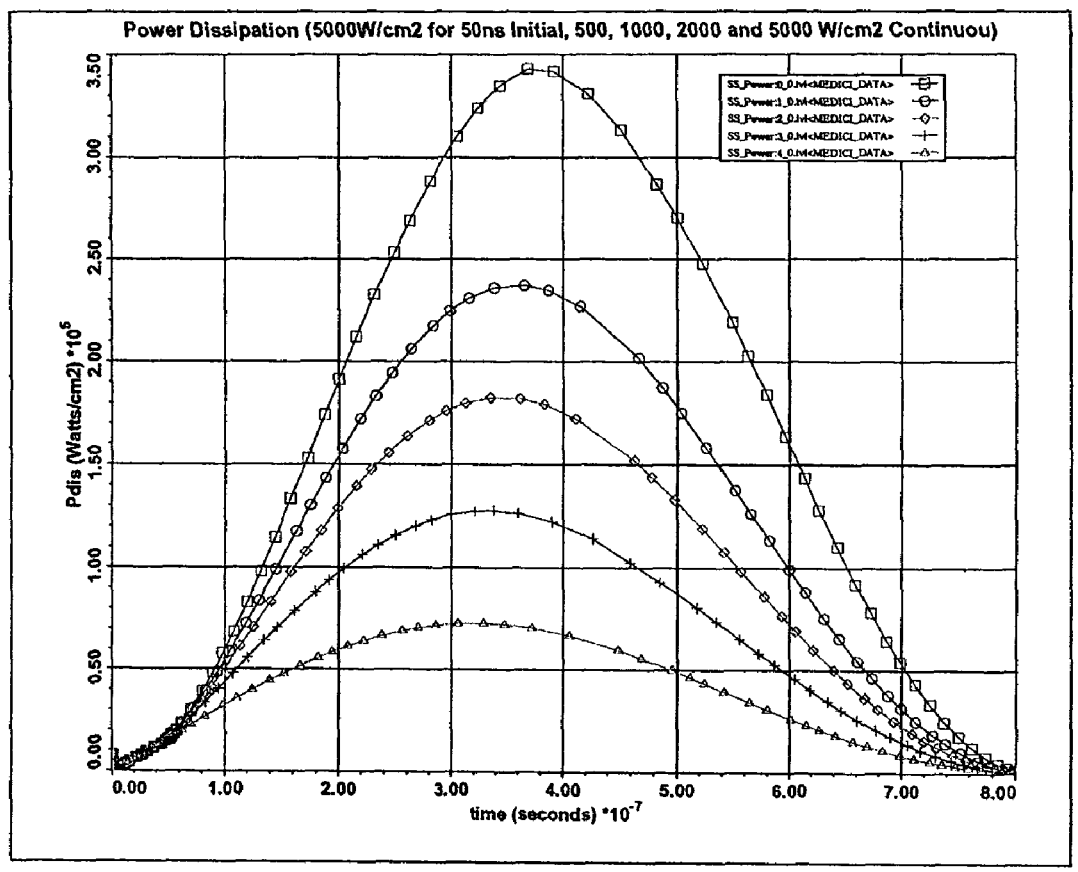

In FIG. 4 the same parameters are used, but for a sinusoidal current pulse of 800 nanoseconds base-to-base width. The uppermost curve is for light triggering only with no pump (50 nsec light pulse). The second through fifth curves are for 500, 1000, 2000 and 5000 watts per cm$^2$ illumination for the full 800 nanosecond current pulse, respectively. The FOM photonic gain numbers are 42, 32, 21 and 11, respectively. As will be appreciated, the continuous laser pumping during current conduction by the switch is a very effective technique for this parameter regime.

Figure 5:
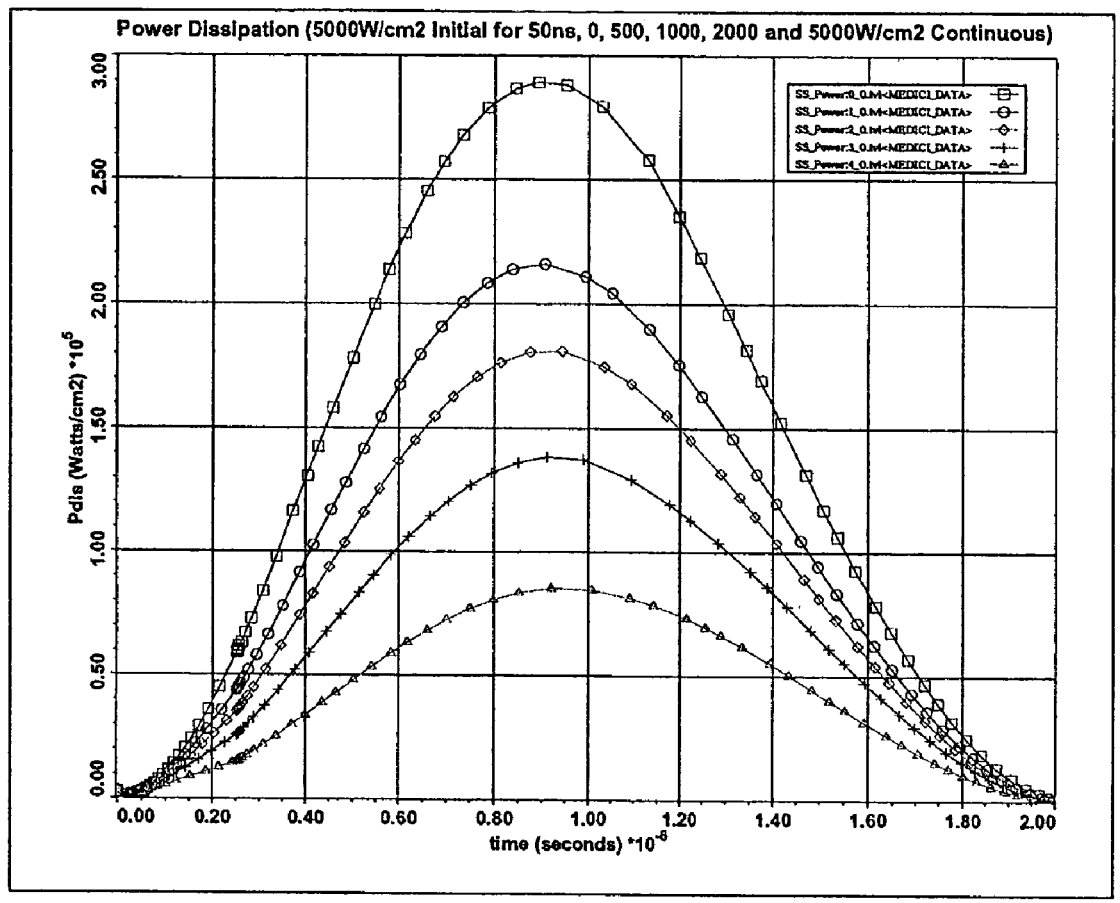

FIG. 5 represents the same parameters, but for a sinusoidal current pulse of 2 microseconds base-to-base width. Again, the uppermost trace curve is for a light triggering pulse (50 nsec) only with no pump. The second through fifth trace curves are for 500, 1000, 2000 and 5000 watts per cm$^2$ illumination for the full 2 $\mu$sec, respectively. The FOM photonic gain numbers are 30, 22, 15 and 9, respectively. Again, these numbers reflect a very effective technique for this parameter regime.

Figure 6:
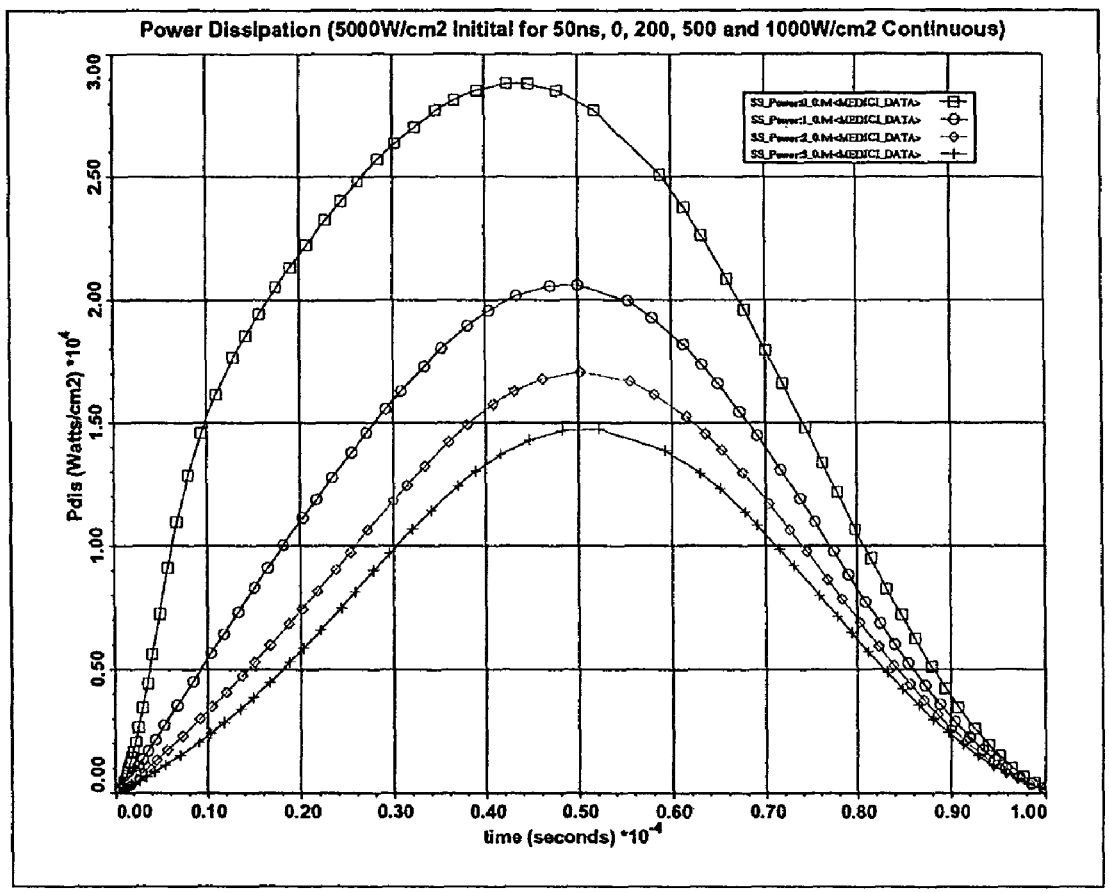

FIG. 6 represents the same parameters, but for a sinusoidal current pulse of 100 microseconds base-to-base width. Again, the uppermost trace curve is for a light triggering pulse (50 nsec) only with no pump. The second through fourth trace curves are for 200, 500, and 1000 watts per cm$^2$ illumination for the full 100 $\mu$sec, respectively. The FOM photonic gain numbers are 8, 4.6 and 2.8 respectively. The 200 watt/cm$^2$ illumination level appears most effective in this parameter regime.

Figure 7:
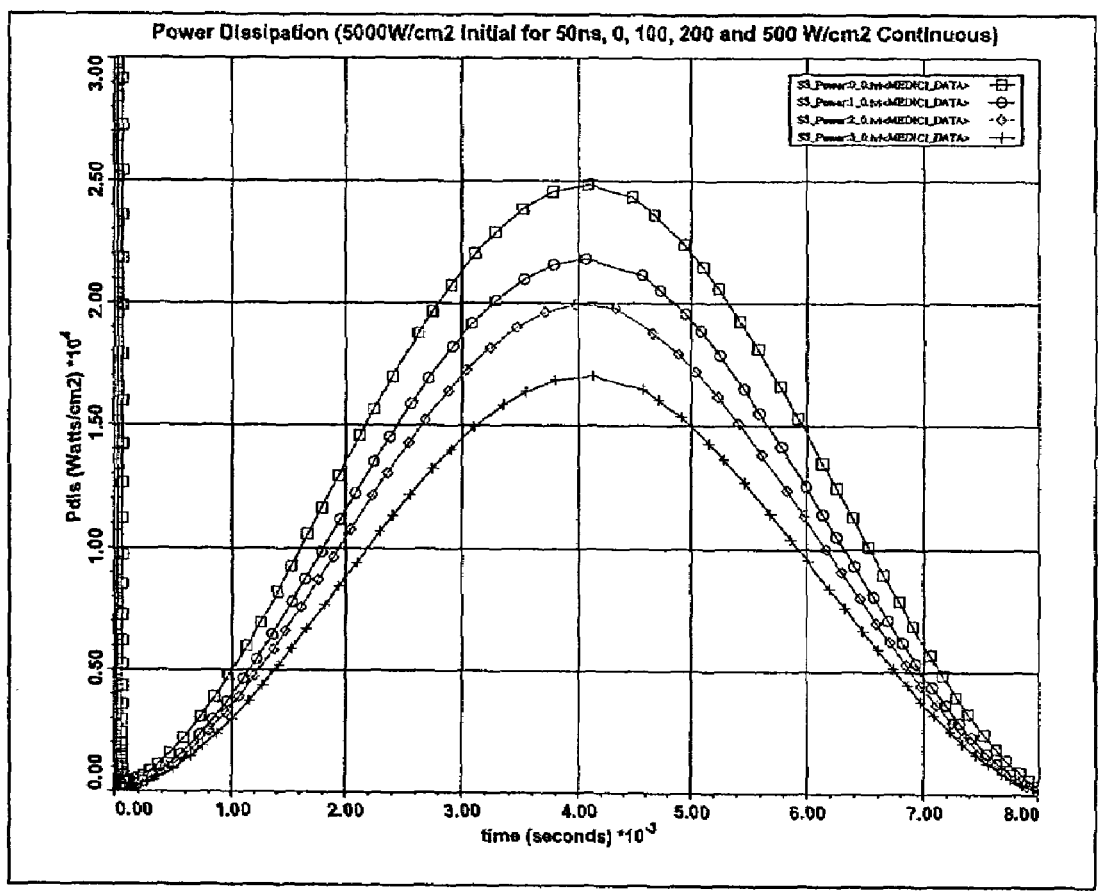

FIG. 7 represents the same parameters, but for a sinusoidal current pulse of 8 milliseconds base-to-base width. Again, the uppermost trace curve is for a light triggering pulse (50 nsec) only with no pump. The second through fourth trace curves are for 100, 200 and 500 watts per cm$^2$ illumination for the full 8 msec, respectively. The FOM photonic gain numbers are 5.8, 5.0 and 3.2 respectively. This parameter regime corresponds to the 60 Hz power distribution case.

Figure 1:
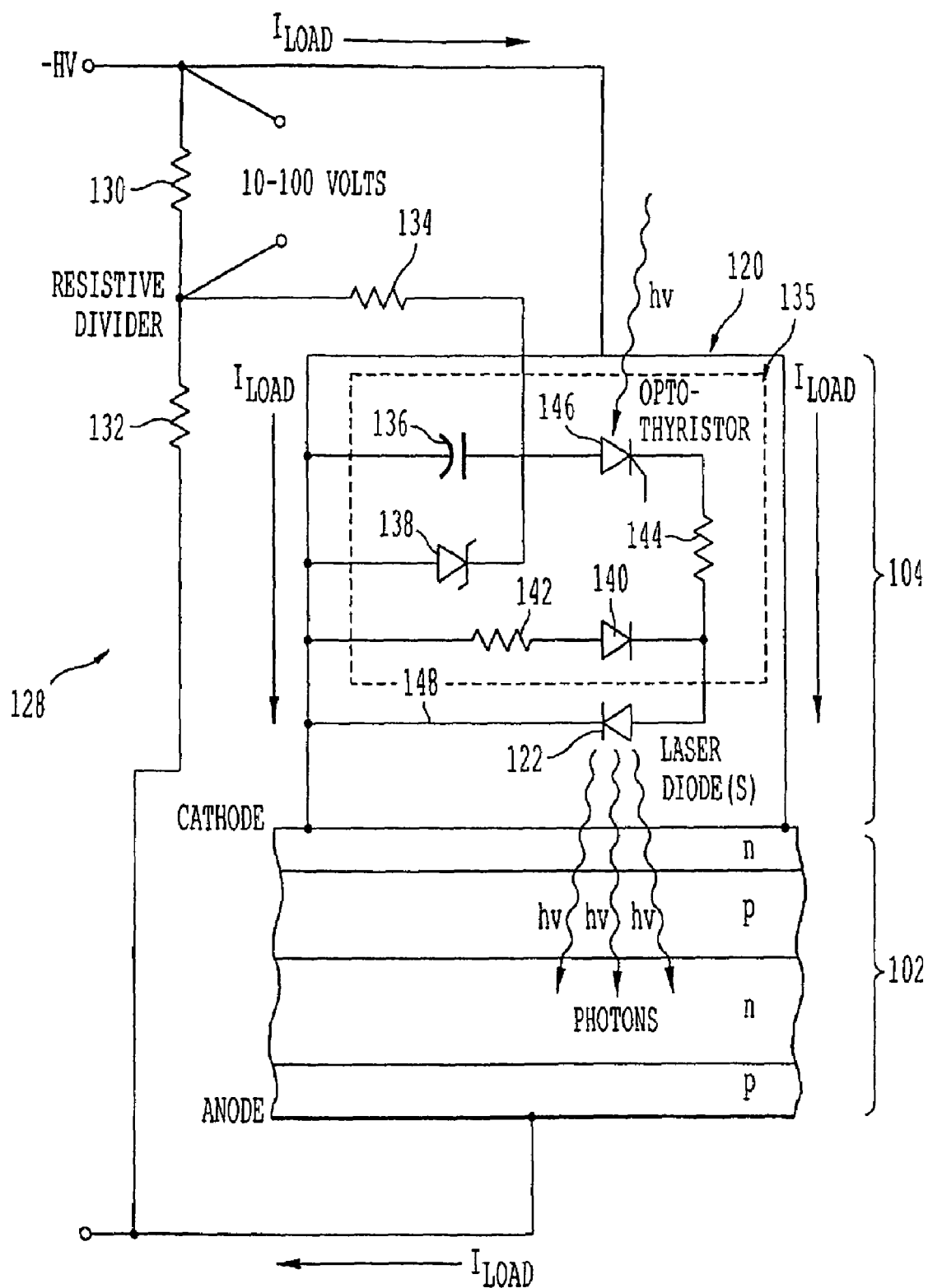
FIG. 1 is a schematic diagram of a semiconductor power switch assembly and driving circuit applicable to the concepts of the present invention.

Although only a few exemplary embodiments of this invention have been described in detail above, those skilled in the art will readily appreciate that many modifications are possible in the exemplary embodiments without materially departing from the novel teachings and advantages of this invention. In particular, the invention also is applicable to configurations that include two laser arrays, where one array is coupled to the cathode as shown in FIG. 1, and another array is coupled to the anode, as disclosed in the '477 patent. In such configurations, an additional drive circuit 128 as shown in FIG. 1 is connected to the additional laser array coupled to the anode. Accordingly, all such modifications are intended to be included within the scope of this invention as defined in the following claims.

What is claimed is:

1. A laser-activated semiconductor switching device, comprising:
   a semiconductor assembly including a multi-layer semiconductor structure having a first principal functioning as a surface; and
   a laser assembly having at least one laser device and being directly connected to said first principal surface;
   wherein said first principal surface includes a window area from which a metallization layer and an emitter layer of said semiconductor assembly are masked, such that laser light emitted from said laser assembly impinges through said window area directly onto a p-base layer of said semiconductor assembly to initiate current conduction by said switching device.

2. The laser-activated semiconductor switching device as set forth in claim 1, wherein said metallization layer terminates directly over said base layer so as to make an ohmic contact with said semiconductor structure.

3. The laser-activated semiconductor switching device as set forth in claim 1, wherein said window has a length in the range of 1–10 mm.

4. The laser-activated semiconductor switching device as set forth in claim 1, wherein said window has a width in the range of 200–1000 microns.

5. The laser-activated semiconductor switching device as set forth in claim 1, wherein said base layer has a thickness of no greater than 100 microns.

6. The laser-activated semiconductor switching device as set forth in claim 1, wherein said emitter layer has a thickness of no greater than 10 microns.

7. The laser-activated semiconductor switching device as set forth in claim 1, wherein said switching device is a quasi-symmetric thyristor.

8. The laser-activated semiconductor switching device as set forth in claim 1, wherein said switching device is a fully asymmetric thyristor.

9. The laser-activated semiconductor switching device as set forth in claim 8, wherein said thyristor includes an n-buffer layer.

10. The laser-activated semiconductor switching device as set forth in claim 8, wherein said thyristor has a base layer with a thickness greater than 50 microns.

11. The laser-activated semiconductor switching device as set forth in claim 1, wherein laser light is emitted from said laser assembly into said window continuously for substantially the entire amount of time that said switching device conducts current.

12. The laser-activated semiconductor switching device as set forth in claim 11, wherein said switching device produces a current pulse of 800 nanoseconds width, and said laser assembly generates a laser light pulse pumped into said switching device at an illumination level of at least 500 watts per $cm^2$ during said 800 nanosecond current pulse.

13. The laser-activated semiconductor switching device as set forth in claim 11, wherein said switching device produces a current pulse of 2 microseconds width, and said laser assembly generates a laser light pulse pumped into said switching device at an illumination level of at least 500 watts per $cm^2$ during said 2 microsecond current pulse.

14. The laser-activated semiconductor switching device as set forth in claim 11, wherein said switching device produces a current pulse of 100 microseconds width, and said laser assembly generates a laser light pulse pumped into said switching device at an illumination level of at least 200 watts per $cm^2$ during said 100 microsecond current pulse.

15. The laser-activated semiconductor switching device as set forth in claim 11, wherein said switching device produces a current pulse of 8 milliseconds width, and said laser assembly generates a laser light pulse pumped into said switching device at an illumination level of at least 100 watts per $cm^2$ during said 8 millisecond current pulse.

16. The laser-activated semiconductor switching device as set forth in claim 1, wherein said first principal surface functions as a cathode, and said multi-layer semiconductor structure has a second principal surface that functions as an anode, said device further comprising:
   a second laser device being directly connected to said second principal surface;
   wherein said second principal surface includes a window area from which a metallization layer and an emitter layer of said semiconductor assembly are masked, such that laser light emitted from said laser assembly impinges through said window area directly onto an n-base layer of said semiconductor assembly to initiate current conduction by said switching device.

17. The laser-activated semiconductor switching device as set forth in claim 16, wherein laser light is emitted from said laser assembly into said window continuously for substantially the entire amount of time that said switching device conducts current.

18. In a laser-activated semiconductor switching device, comprising a semiconductor assembly including a multi-layer semiconductor structure having a first principal surface and a laser assembly having at least one laser device and being directly connected to said first principal surface, a method of operating said laser-activated switching device comprising the step of pumping laser light from said laser assembly into said semiconductor structure for substantially the entire amount of time during which said semiconductor switching device produces a current pulse.

19. The method of operating a laser-activated semiconductor switching device as set forth in claim 18, wherein said switching device produces a current pulse of 800 nanoseconds width, and said laser assembly generates a laser light pulse pumped into said switching device at an illumination level of at least 500 watts per $cm^2$ during said 800 nanosecond current pulse.

20. The method of operating a laser-activated semiconductor switching device as set forth in claim 18, wherein said switching device produces a current pulse of 2 microseconds width, and said laser assembly generates a laser light pulse pumped into said switching device at an illumination level of at least 500 watts per $cm^2$ during said 2 microsecond current pulse.

21. The method of operating a laser-activated semiconductor switching device as set forth in claim 18, wherein said switching device produces a current pulse of 100 microseconds width, and said laser assembly generates a laser light pulse pumped into said switching device at an illumination level of at least 200 watts per $cm^2$ during said 100 microsecond current pulse.

22. The method of operating a laser-activated semiconductor switching device as set forth in claim 18, wherein said switching device produces a current pulse of 8 milliseconds width, and said laser assembly generates a laser light pulse pumped into said switching device at an illumination level of at least 100 watts per $cm^2$ during said 8 millisecond current pulse.

* * * * *